US011749951B2

(12) United States Patent
Wang et al.

(10) Patent No.: US 11,749,951 B2
(45) Date of Patent: Sep. 5, 2023

(54) ELECTRICAL CONNECTOR WITH SHIELDING COVERING HEAT DISSIPATING ELEMENTS

(71) Applicant: Dongguan Luxshare Technologies Co., Ltd, Dongguan (CN)

(72) Inventors: XiaoKai Wang, Dongguan (CN); XiaoPing Wu, Dongguan (CN); BaiYu Duan, Dongguan (CN)

(73) Assignee: DONGGUAN LUXSHARE TECHNOLOGIES CO., LTD., Dongguan (CN)

( * ) Notice: Subject to any disclaimer, the term of this patent is extended or adjusted under 35 U.S.C. 154(b) by 11 days.

(21) Appl. No.: 17/404,357

(22) Filed: Aug. 17, 2021

(65) Prior Publication Data

US 2022/0059973 A1 Feb. 24, 2022

(30) Foreign Application Priority Data

Aug. 19, 2020 (CN) .......................... 202010836592.6

(51) Int. Cl.
*H01R 13/6582* (2011.01)
*H01R 12/71* (2011.01)
(Continued)

(52) U.S. Cl.
CPC ......... *H01R 13/6582* (2013.01); *H01R 12/53* (2013.01); *H01R 12/71* (2013.01);
(Continued)

(58) Field of Classification Search
CPC .... H01R 13/6582; H01R 12/53; H01R 12/71; H01R 13/502; H01R 13/629;
(Continued)

(56) References Cited

U.S. PATENT DOCUMENTS 10,104,760 B1 * 10/2018 Briant ................. G02B 6/4284
11,073,667 B1 * 7/2021 Wang .................. G02B 6/4261
2018/0205184 A1 7/2018 Briant et al.

FOREIGN PATENT DOCUMENTS

| CN | 107959139 A | * | 4/2018 | ......... B60R 16/0207 |
| CN | 109038054 A | | 12/2018 | |
| TW | I668928 B | | 8/2019 | |

* cited by examiner

*Primary Examiner* — Abdullah A Riyami
*Assistant Examiner* — Justin M Kratt
(74) *Attorney, Agent, or Firm* — Birch, Stewart, Kolasch & Birch, LLP

(57) ABSTRACT

An electrical connector, comprising a housing, a circuit board, a cable, and a shielding member. The housing comprises an accommodating space and a plurality of through grooves. The plurality of through grooves are disposed on an inner surface of the housing along a first direction at intervals. Each of the through grooves extends in a second direction and penetrates the housing. The second direction is orthogonal to the first direction. The circuit board is disposed in the accommodating space and protrudes from the housing. The cable is disposed in the accommodating space. One end of the cable protrudes from the housing. One end of the cable disposed in the accommodating space is connected to the circuit board. The shielding member is disposed in the accommodating space and covers the plurality of through grooves. The accommodating space and the plurality of through grooves are partitioned by the shielding member.

15 Claims, 6 Drawing Sheets

(51) Int. Cl.
*H01R 13/502* (2006.01)
*H01R 13/629* (2006.01)
*H01R 13/6594* (2011.01)
*H01R 13/6581* (2011.01)
*H01R 12/53* (2011.01)
*H05K 7/20* (2006.01)
*H01R 13/627* (2006.01)
*H01R 13/633* (2006.01)
*H01R 13/518* (2006.01)

(52) U.S. Cl.
CPC ......... *H01R 13/502* (2013.01); *H01R 13/629* (2013.01); *H01R 13/6581* (2013.01); *H01R 13/6594* (2013.01); *H05K 7/20* (2013.01); *H01R 13/518* (2013.01); *H01R 13/6275* (2013.01); *H01R 13/6335* (2013.01); *H05K 7/2039* (2013.01); *H05K 7/20409* (2013.01); *H05K 7/20436* (2013.01)

(58) Field of Classification Search
CPC ............ H01R 13/6581; H01R 13/6594; H01R 13/6275; H01R 13/6335; H05K 7/20; H05K 7/2039; H05K 7/20409; H05K 7/20436
See application file for complete search history.

ELECTRICAL CONNECTOR WITH SHIELDING COVERING HEAT DISSIPATING ELEMENTS

CROSS-REFERENCE TO RELATED APPLICATION

This application claims the priority benefit of Chinese Patent Application Serial Number 202010836592.6, filed on Aug. 19, 2020, the full disclosure of which is incorporated herein by reference.

BACKGROUND

Technical Field

The present disclosure relates to the technical field of connector, particularly to an electrical connector.

Related Art

Conventional connectors are covered by housing. In order to dissipate the heat generated by the connector from the inside of the housing to the outside, holes are usually made on the housing. By doing so, the heat dissipation for the connector is improved. However, the improved effect is still far from satisfying the standard of heat dissipation, which also brings up another issue, that is, the electromagnetism generated by the connector is easily transmitted from the holes of the housing to the outside and interferes with neighboring electronic devices, or the electromagnetism of neighboring electronic devices can easily enter the housing through the holes and interfere with the connector during the signal transmission process. Thus, the signal transmission performance of the connector is significantly affected.

SUMMARY

The embodiments of the present disclosure provide an electrical connector tended to solve the problem of poor signal transmission performance due to the holes on the housing of the connectors.

The present disclosure provides an electrical connector, comprising a housing, a circuit board, a cable, and a shielding member. The housing comprises an accommodating space and a plurality of through grooves. The plurality of through grooves are disposed on an inner surface of the housing along a first direction at intervals. Each of the through grooves extends in a second direction and penetrates the housing. The second direction is orthogonal to the first direction. The circuit board is disposed in the accommodating space and protrudes from the housing. The cable is disposed in the accommodating space. One end of the cable protrudes from the housing. One end of the cable disposed in the accommodating space is connected to the circuit board. The shielding member is disposed in the accommodating space and covers the plurality of through grooves. The accommodating space and the plurality of through grooves are partitioned by the shielding member.

In the embodiments of the present disclosure, by partitioning the accommodating space and the plurality of through grooves with the shielding member, communication between the accommodating space and the outside of the electrical connector through a plurality of through grooves can be effectively blocked. Thus, the shielding member could perform electromagnetic shielding, and the electrical connector would perform excellent signal transmission.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include". "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . ." does not exclude other same elements existing in the process, the method, the article, or the device which includes the element.

Figure 1:
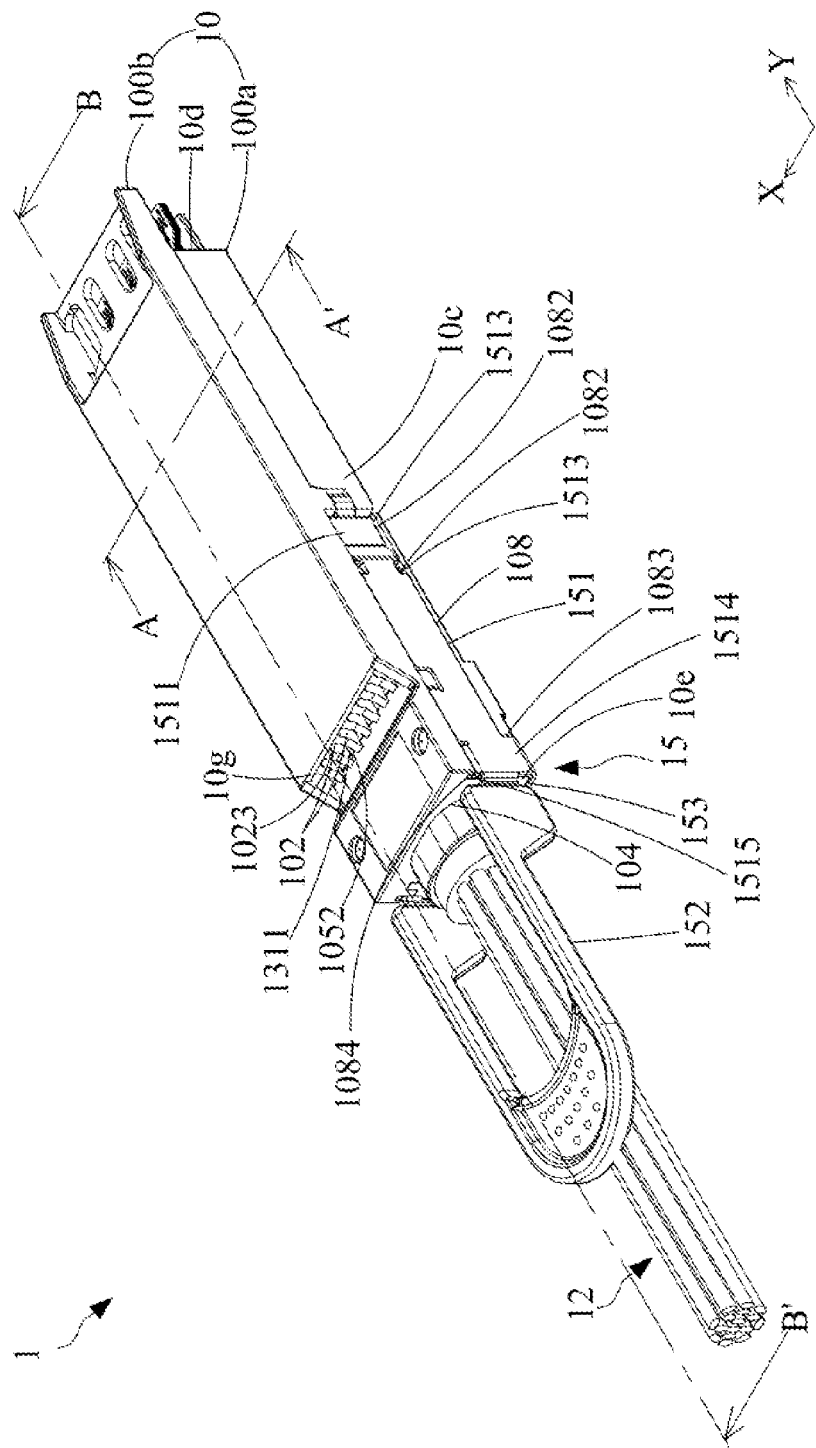
FIG. 1 is a perspective view of an electrical connector of an embodiment of the present disclosure.
Figure 2:
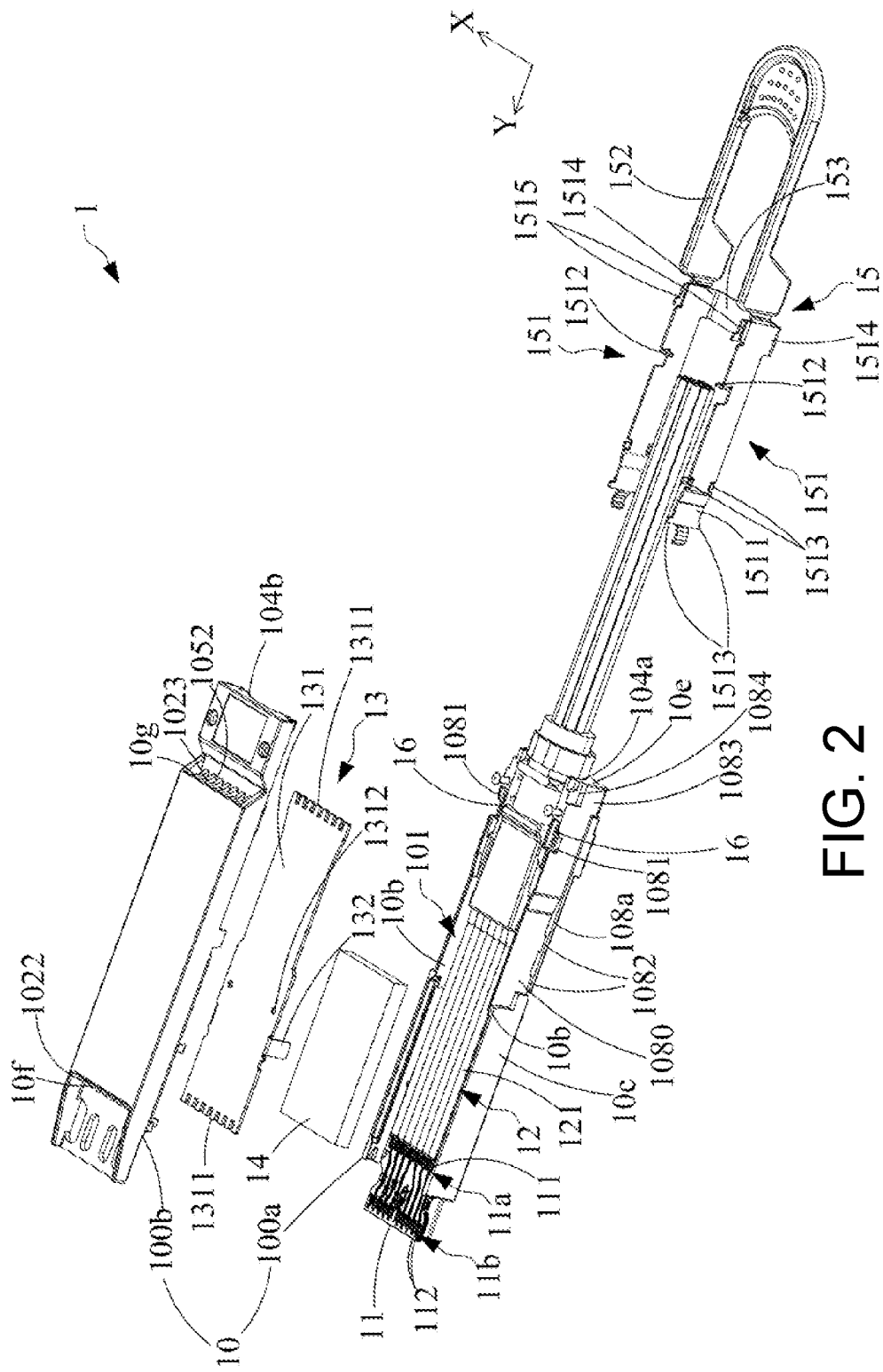
FIG. 2 is an exploded view of an electrical connector of an embodiment of the present disclosure.
Figure 3:
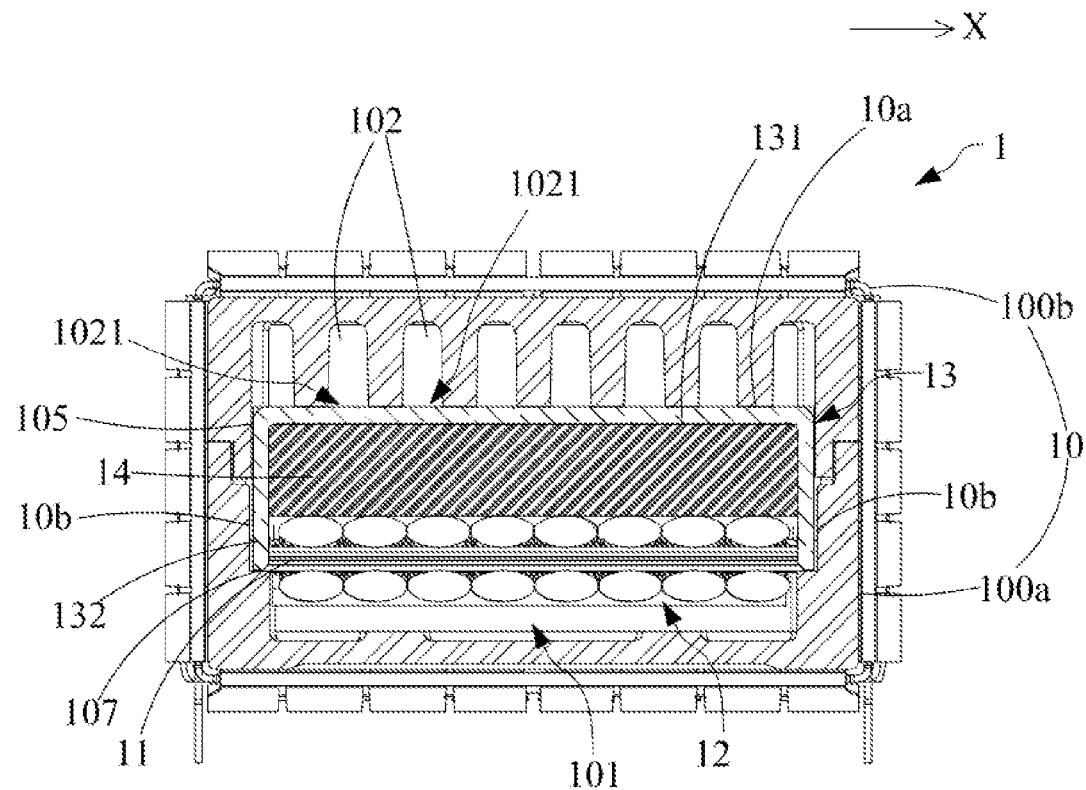
FIG. 3 is a cross-sectional view along line A-A in FIG. 1.
Figure 4:
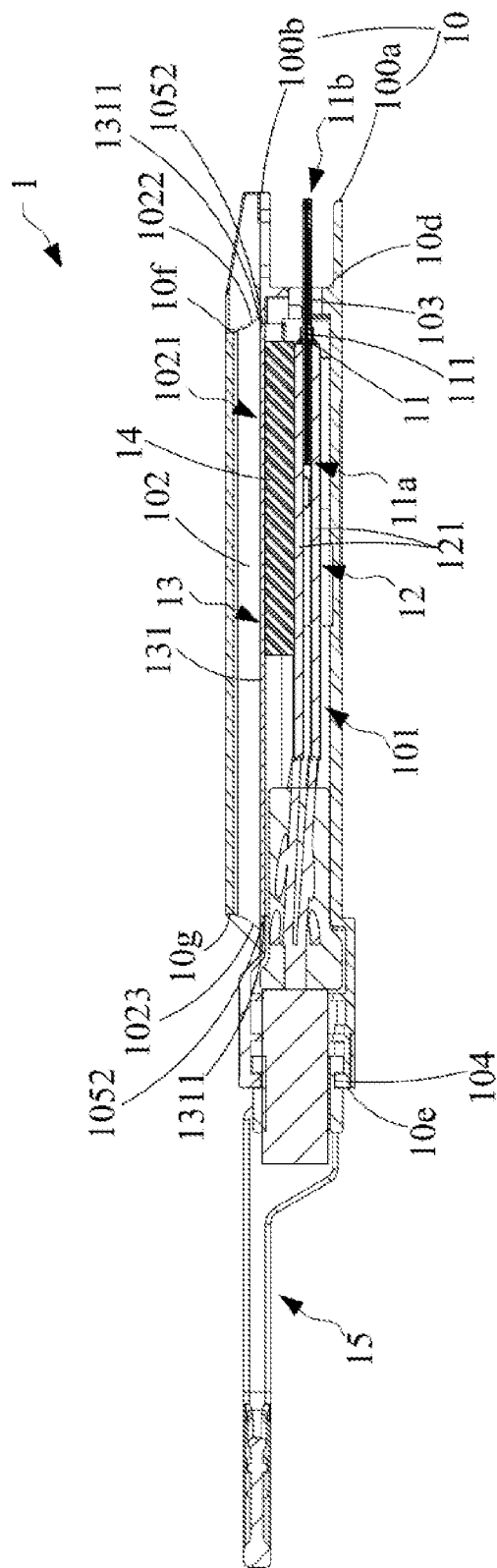
FIG. 4 is a cross-sectional view along line B-B' in FIG. 1.

FIG. 1 and FIG. 2 are perspective view and exploded view of an electrical connector of an embodiment of the present disclosure. FIG. 3 is a cross-sectional view along line A-A' in FIG. 1. FIG. 4 is a cross-sectional view along line B-B' in FIG. 1. As shown in the figures, the electrical connector 1 of this embodiment comprises a housing 10, a circuit board 11, a cable 12 and a shielding member 13. The housing 10 comprises an accommodating space 101 and a plurality of through grooves 102. The plurality of through grooves 102 are disposed on an inner surface of the housing 10 along a first direction X at intervals. The plurality of through grooves 102 communicate with the accommodating space 101. Each of the through grooves 102 extends along a second direction Y orthogonal to the first direction X. Two ends of each of the through grooves 102 penetrate two opposite outer surfaces of the housing 10 in the second direction Y. The accommodating space 101 could communicate with the outside of the electrical connector 1 through the plurality of through grooves 102.

In this embodiment, the housing 10 comprises a first inner surface 10a and two second inner surfaces 10b. The first inner surface 10a is disposed between the two second inner surfaces 10b. The first inner surface 10a is disposed in a direction parallel to the first direction X. The plurality of through grooves 102 are disposed on the first inner surface 10a along the first direction X at intervals. The two second inner surfaces 10b are oppositely disposed in the first direction X. In this embodiment, the housing 10 further comprises two first outer surfaces 10c, a first end surface 10d, and a second end surface 10e. The two first outer surfaces 10c are oppositely disposed along the first direction X. The two first outer surfaces 10c respectively correspond to the two second inner surfaces 10b. The first end surface 10d and the second end surface 10e are oppositely disposed along the second direction Y.

Figure 5:
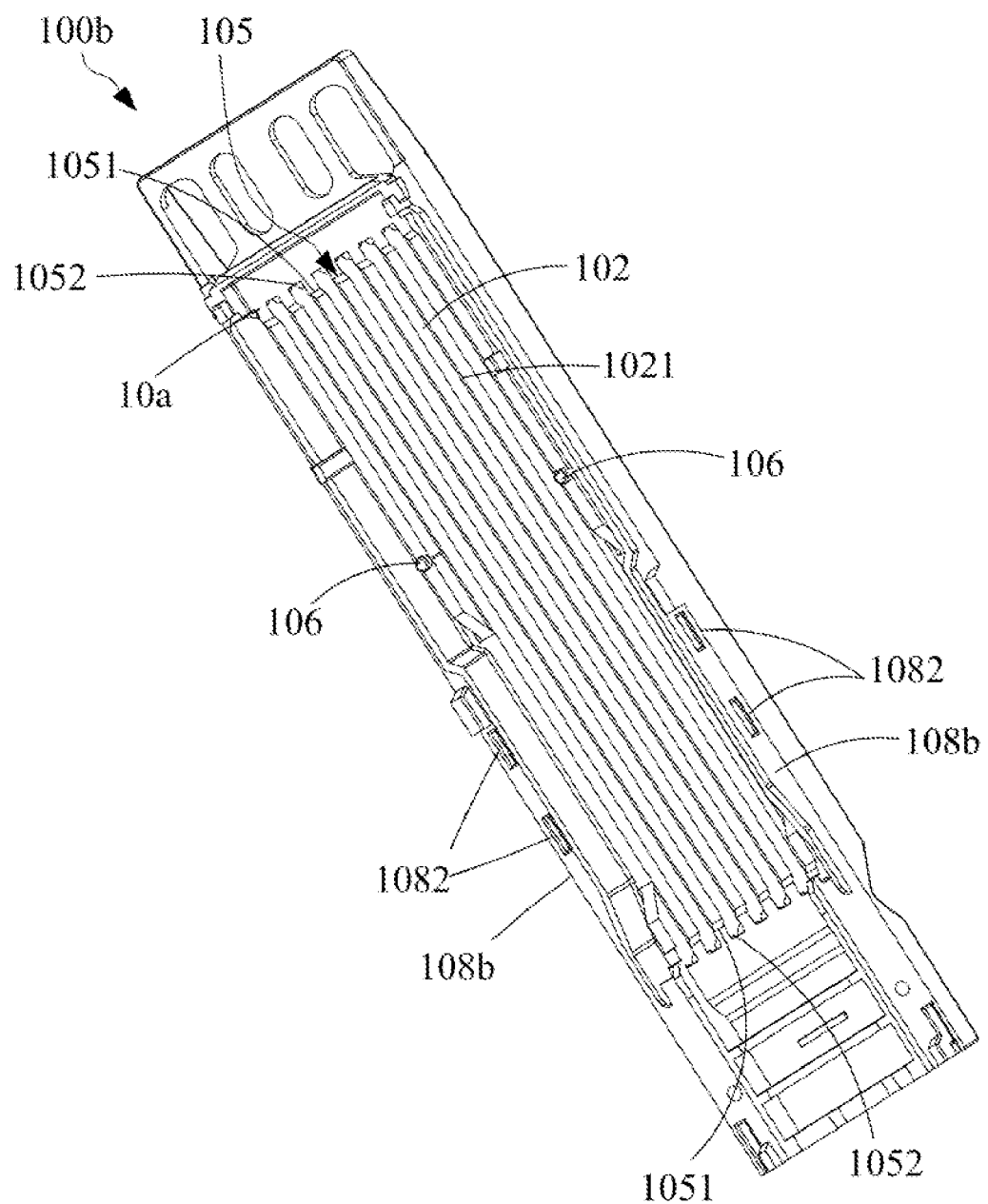
FIG. 5 is a perspective view of the second housing of an embodiment of the present disclosure.

FIG. 5 is a perspective view of the second housing of an embodiment of the present disclosure. Specifically, in this embodiment, as shown in the figure, the housing 10 comprises a first housing 100a and a second housing 100b. The first housing 100a comprises an accommodating space 101 formed by disposing the second housing 100b on the first housing 100a, and the plurality of through grooves 102 are disposed on an inner surface of the second housing 100b (the first inner surface 10a). The housing 10 further comprises a second outer surface 10f and a third outer surface 10g. The second outer surface 10f is opposite to the third outer surface 10g and is in the second direction Y. The second outer surface 10f is close to the first end surface 10d of the housing 10, and the second outer surface 10f is close to the second end surface 10e of the housing 10. In this embodiment, the second outer surface 10f and the third outer surface 10g are disposed on a surface of the second housing 100b away from the first housing 100a. Two ends of each of the through grooves 102 respectively penetrate the second outer surface 10f and the third outer surface 10g. Each of the through grooves 102 forms a first opening 1021 on the first inner surface 10a, a second opening 1022 on the second outer surface 10f, and a third opening 1023 on the third outer surface 10g. In this embodiment, the first housing 100a and the second housing 100b are assembled to form the housing 10. When the housing 10 is integrally formed, the plurality of through grooves 102 are formed on the first inner surface 10a of the housing 10.

The circuit board 11 is disposed in the accommodating space 101 and protrudes from the first end surface 10d of the housing 10. In one embodiment, the housing 10 comprises a plugging opening 103 disposed on the first end surface 10d of the housing 10. Specifically, the circuit board 11 comprises a connecting end 11a and a plugging end 11b. The connecting end 11a of the circuit board 11 is disposed in the accommodating space 101, and the plugging end 11b of the circuit board 11 is disposed at the outside of the first end surface 10d of the housing 10. The cable 12 penetrates into the accommodating space 101 through the second end surface 10e of the housing 10, then is connected to the connecting end 11a of the circuit board 11. In one embodiment, the second end surface 10e of the housing 10 comprises a wiring hole 104 communicating with the accommodating space 101. One end of the cable 12 connected to the circuit board 11 enters the accommodating space 101 through the wiring hole 104. Specifically, the wiring hole 104 is disposed on the first housing 100a and the second housing 100b, that is, the first housing 100a comprises a first wiring gap 104a, and the second housing 100b further comprises a second wiring gap 104b. The first wiring gap 104a of the first housing 100a and the second wiring gap 104b of the second housing 100b are connected to form the wiring hole 104.

The shielding member 13 is disposed in the accommodating space 101 and covers the plurality of through grooves 102 to partition the accommodating space 101 and the plurality of through grooves 102. Thus, the shielding member 13 blocks the communication between the plurality of through grooves 102 and the accommodating space 101 and also blocks the communication between the accommodating space 101 and the outside area of the electrical connector 1. Specifically, the shielding member 13 of this embodiment is disposed on the first inner surface 10a of the housing 10. The shielding member 13 closes the plurality of first openings 1021 formed on the first inner surface 10a of the housing 10 by the plurality of through grooves 102 to block the communication between the plurality of through grooves 102 and the accommodating space 101. Thus, the outside area of the electrical connector 1 could be communicating with the plurality of through grooves 102 but is blocked by the shielding member 13 and is not communicating with the accommodating space 101. In other words, the external airflow could enter the corresponding through grooves 102 through the plurality of second openings 1022 (or the plurality of third openings 1023), and exit from the plurality of third openings 1023 (or the plurality of second openings 1022). In this embodiment, two sides of the shielding member 13 further abut against the two second inner surfaces 10b respectively. In this way, it can be ensured that there would be no gap between the shielding member 13 and the two second inner surfaces 10b to block the communication between the accommodating space 101 and the outside area of the electrical connector 1.

When the electrical connector 1 is plugged into a mating connector, the shielding member 13 could prevent electromagnetic interference generated by the circuit board 11 and the cable 12 during signal transmission. In other words, the shielding member 13 could close the plurality of through grooves 102 to effectively prevent electromagnetism generated by the circuit board 11 and the cable 12 from greatly leaking from the plurality of through grooves 102 to the outside area of the electrical connector 1 during signal transmission, and to prevent external electromagnetism from entering the accommodating space 101 through the plurality of through grooves 102 which affects the operation of the circuit board 11 and the cable 12. In this way, the shielding member 13 of this embodiment could perform electromagnetic shielding to effectively eliminate crosstalking during the signal transmission process of the electrical connector 1, allowing the electrical connector 1 to perform excellent signal transmission.

Besides, when the shielding member 13 is made of a material having high heat conductivity, such as metal, it would harvest and retain the heat. When using the electrical connector 1, the heat generated by the circuit board 11 and the cable 12 can be harvested by the shielding member 13. A fan or other air extraction device can be disposed at the outside of the electrical connector 1 and can disturb the airflow outside the electrical connector 1, i.e., allowing the air outside the electrical connector 1 to be flowing to enter the corresponding through groove 102 from the second opening 1022 (or the third opening 1023). The air entering the through groove 102 could bring the heat from the shielding member 13 and exit from the third opening 1023 (or the second opening 1022) to improve the heat dissipation of the electrical connector 1.

In this embodiment, the shielding member 13 can be movably disposed on the housing 10, so the material of the shielding member 13 can be different or the same as the material of the housing 10, and the material of the housing 10 and the material of the shielding member 13 can be selected according to the required performance of the electrical connector 1. When the electrical connector 1 needs to perform excellent electromagnetic shielding and heat dissipation, the housing 10 and the shielding member 13 can be made of materials which are simultaneously electromagnetically shieldable and heat conductive. Or, the housing 10 can be made of good a material having high thermal conductivity, and the shielding member 13 can be made of good a material which is electromagnetically shieldable in excellent. When electromagnetic shielding of the electrical connector 1 is emphasized, the shielding member 13 can be made of a material which is electromagnetically shieldable in excellent, such as conductive plastic or electroplated plastic. The housing 10 can be made of a material which is both electromagnetically shieldable and heat conductive, especially a material having the effect of electromagnetic shielding better than heat conduction. When heat conducting of the electrical connector 1 is emphasized, the shielding member 13 can be made of a material having high heat conductivity, such as metal. The housing 10 can be made of a material which is both electromagnetically shieldable and heat conductive, especially a material having the effect of heat conduction better than electromagnetic shielding.

Thus, the housing 10 and the shielding member 13 can be made of a material according to the required performance of the electrical connector 1 since the shielding member 13 and the housing 10 are separately disposed. In this way, the electrical connector 1 could achieve the expected performance and satisfy the requirements. Meanwhile, the individual manufacturing of the shielding member 13 and the housing 10 could simplify the manufacturing process and reduce costs.

In one embodiment, the housing 10 further comprises an accommodating gap 105 disposed on the first inner surface 10a having a plurality of through grooves 102. The accommodating gap 105 communicates with the plurality of through grooves 102 and is closer than the plurality of through grooves 102 to the accommodating space 101. Specifically, the accommodating gap 105 is disposed on the first inner surface 10a of the second housing 100b. When the shielding member 13 comprises not been disposed in the housing 10, the accommodating space 101 is in communication with the plurality of through grooves 102 through the accommodating gap 105. When the shielding member 13 is disposed in the housing 10, the shielding member 13 would be disposed in the accommodating gap 105 and would abut against a partition wall between the two adjacent through grooves 102. Thus, each of the plurality of through grooves 102 is not connected to other through grooves 102, that is, each of the through grooves 102 forms an independent channel.

In this embodiment, two opposite sidewalls 1051 of the accommodating gap 105 in the second direction Y respectively comprise an engaging recess 1052. The shielding member 13 comprises a shielding plate body 131, two opposite ends of which are respectively provided with an engaging bump 1311. When the shielding member 13 is disposed in the housing 10, the engaging bumps 1311 of the shielding member 13 are respectively disposed in the corresponding engaging recesses 1052 to secure the shielding member 13 in the housing 10. Specifically, the sidewall 1051 of the accommodating notch 105 corresponding to the second outer surface 10f comprises a plurality of engaging recesses 1052 disposed at intervals. The plurality of engaging recesses 1052 respectively correspond to the plurality of second openings 1022. The sidewall 1051 of the accommodating gap 105 corresponding to the third outer surface 10g comprises a plurality of engaging recesses 1052 disposed at intervals. The plurality of engaging recesses 1052 respectively correspond to the plurality of third openings 1023. One end of the shielding plate body 131 close to the first end surface 10d comprises a plurality of engaging bumps 1311 disposed at intervals, and one end of the shielding plate body 131 close to the second end surface 10e comprises a plurality of engaging bumps 1311 disposed at intervals. The plurality of engaging bumps 1311 respectively cooperate with the corresponding engaging recesses 1052 to secure the shielding member 13 in the housing 10. In one embodiment, the shielding plate body 131 comprises a positioning hole 1312, and the second housing 100b comprises a positioning column 106 disposed on the partition sidewall between two adjacent through grooves 102. When the shielding member 13 is disposed in the housing 10, the positioning column 106 would be inserted into the positioning hole 1312 to position the shielding member 13 in the housing 10.

In one embodiment, the electrical connector 1 further comprises a heat conducting member 14 disposed between the cable 12 and the shielding member 13. The heat conducting member 14 covers one end of the cable 12 connected to the circuit board 11 to quickly conduct the heat generated by the circuit board 11 and the cable 12 to the shielding member 13 to accelerate the speed of the shielding member 13 to collect heat energy, and to further improve the heat dissipation of the electrical connector 1. In this embodiment, the material of the heat conducting member 14 is heat conducting silica gel. The heat conducting member 14 can be made of other heat conducting materials, which should not be limited thereto.

In this embodiment, the shielding member 13 further comprises a plurality of limiting pieces 132 respectively disposed on two opposite sides of the shielding plate body 131. When the shielding member 13 is disposed in the housing 10, the plurality of limiting pieces 132 would extend into the accommodating space 101, that is, to extend in a direction away from the first inner surface 10a. The plurality of limiting pieces 132 are disposed on two sides of the heat conducting member 14, the cable 12 and the circuit board 11 to limit the heat conducting member 14 to be between the shielding plate body 131 and the cable 12. In this embodiment, the two opposite second inner surfaces 10b of the housing 10 in the first direction X respectively comprise a supporting bump 107. When the shielding member 13 is disposed in the housing 10, one ends of the plurality of limiting pieces 132 away from the shielding plate body 131 would abut against the corresponding supporting bumps 107. By supporting the shielding member 13 by the supporting bump 107, the shielding plate body 131 is adjacent to the plurality of partition sidewalls among the plurality of through grooves 102 to secure the shielding member 13 in the housing 10.

In this embodiment, the circuit board 11 comprises a plurality of conductive pads 111 and a plurality of contacting pads 112. The plurality of conductive pads 111 are disposed at an connecting end 11a of the circuit board 11 at intervals, the plurality of contacting pads 112 are disposed at the plugging end 11b of the circuit board 11 at intervals, and the plurality of conductive pads 111 and the plurality of contacting pads 112 are connected by a plurality of circuits. The cable 12 comprises a plurality of wires 121 respectively connected to the corresponding conductive pads 111.

In one embodiment, the electrical connector 1 further comprises a latching component 15 movably disposed on the housing 10. When the electrical connector 1 is plugging into the mating connector, the latching component 15 would buckle with the mating connector in which the electrical connector 1 could be fixed. When the electrical connector 1 needs to be detached from the mating connector, the electrical connector 1 can be detached from the mating connector by pulling the latching component 15 to release the buckling between the latching component 15 and the mating connector. In this embodiment, the latching component 15 comprises two latching elastic pieces 151 and a release handle 152. The two latching elastic pieces 151 are symmetrically disposed, and the release handle 152 is respectively connected with the two latching elastic pieces 151. One end of each of the latching elastic pieces 151 away from the release handle 152 is provided with a buckling recess 1511. The two first outer surfaces 10c of the housing 10 orthogonal to the first direction X respectively comprise an accommodating groove 108. Each of the accommodating grooves 108 extends along the second direction Y. One end of each of the accommodating grooves 108 penetrates the second end surface 10e of the housing 10. Specifically, the two latching elastic pieces 151 are movably disposed in the corresponding accommodating groove 108, respectively. The buckling recess 1511 is recessed toward the accommodating space 101 close to the housing 10, and the release handle 152 extends in a direction away from the housing 10 from the second end surface 10e of the housing 10. In this embodiment, the accommodating groove 108 comprises a recessed part 1080 disposed between the first end surface 10d and the second end surface 10e. The buckling recess 1511 of the latching elastic piece 151 is disposed in the recessed part 1080 so that the latching elastic piece 151 can be close to a surface of the accommodating groove 108 in the first direction X. When the electrical connector 1 is plugged into the mating connector, the buckling elastic piece of the mating connector would enter the buckling recess 1511 of the latching elastic piece 151.

When detaching the electrical connector 1 from the mating connector, the release handle 152 can be pulled to drive the two latching elastic pieces 151 to away from the first end surface 10d of the housing 10, so that the buckling elastic pieces of the mating connector can be detached from the buckling recess 1511 of the corresponding latching elastic piece 151 to release the buckling between each of the latching elastic pieces 151 and the mating connector and to further detach the electrical connector 1 from the mating connector. In this embodiment, the accommodating groove 108 is disposed in the first housing 100a and the second housing 100b. Two sides of the first housing 100a are respectively provided with a lower accommodating groove 108a, and two sides of the second housing 100b are respectively provided with an upper accommodating groove 108b. When the second housing 100b is disposed on the first housing 100a, each of the upper accommodating grooves 108b is engaged with the corresponding lower accommodating groove 108a to form an accommodating groove 108.

Figure 6:
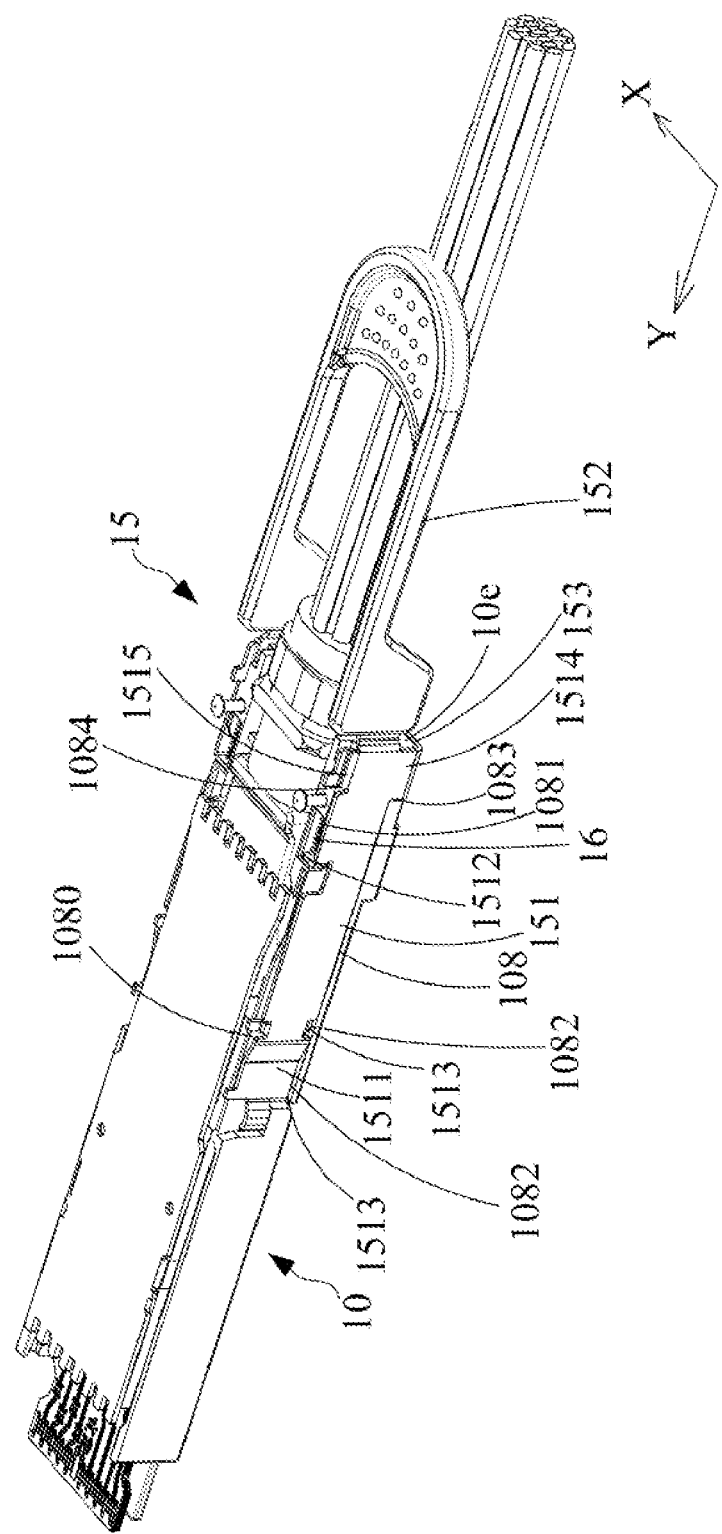
FIG. 6 is a partially exploded view of an electrical connector of an embodiment of the present disclosure.

FIG. 6 is a partially exploded view of an electrical connector of an embodiment of the present disclosure. In one embodiment, as shown in the figure, a surface of each of the accommodating grooves 108 in the first direction X further comprises a release recess 1081. Each of the release recesses 1081 extends along the second direction Y. The release recess 1081 of this embodiment is disposed on the first housing 100a. One side of each of the latching elastic pieces 151 is provided with a release bump 1512 disposed between the buckling recess 1511 and the release handle 152. When each of the latching elastic pieces 151 is movably disposed in the corresponding accommodating groove 108, the release bump 1512 would extend into the release recess 1081, each of the latching elastic pieces 151 would move in the accommodating groove 108, and the release bump 1512 would also move in the release recess 1081. This indicates that the width of the release bump 1512 in the second direction Y is narrower than the width of the release recess 1081 in the second direction Y so that the release bump 1512 could be moving in the release recess 1081. In this embodiment, the electrical connector 1 further comprises two elastic members 16, which are respectively disposed in the corresponding release recess 1081. Each of the elastic members 16 extends along the second direction Y. One end of each of the elastic members 16 abuts against the release bump 1512, and the other end abuts against a surface of the release recess 1081 in the second direction Y close to the second end surface 10e of the housing 10, that is, abutting against the surface of the release recess 1081 away from the release bump 1512. When the latching elastic piece 151 is pulled by the release handle 152 to move away from the first end surface 10d of the housing 10, the release bump 1512 would compress the elastic member 16. Once the pulling on the latching elastic piece 151 by the release handle 152 has stopped, the elastic force generated by the compressed elastic member 16 would push the release bump 1512 to move in a direction closing to the first end surface 10d of the housing 10. This would drive the latching elastic piece 151 to move in a direction closing to the first end surface 10d of the housing 10 so that the latching component 15 can be restored to the state of unpulled.

In one embodiment, two opposite surfaces of each of the accommodating grooves 108 in a direction orthogonal to the first direction X further comprises a limiting recess 1082 extending along the second direction Y. In this embodiment, each of the lower accommodating grooves 108a of the first housing 100a comprises two limiting recesses 1082, and each of the upper accommodating grooves 108b of the second housing 100b comprises two limiting recesses 1082. The plurality of limiting recesses 1082 of the second housing 100b respectively correspond to the plurality of limiting recesses 1082 of the first housing 100a. Two sides of each of the latching elastic pieces 151 are respectively provided with a limiting bump 1513 disposed between the buckling recess 1511 and the release bump 1512, i.e., the limiting bump 1513 is closer than the release bump 1512 to the buckling recess 1511. When each of the latching elastic pieces 151 is movably disposed in the corresponding accommodating groove 108, each of the limiting bumps 1513 would extend into the corresponding limiting recess 1082. Each of the latching elastic pieces 151 moves in the accommodating groove 108, and the limiting bump 1513 also moves in the limiting recess 1082, which means that the width of the limiting bump 1513 in the second direction Y is narrower than the width of the limiting recess 1082 in the second direction Y, so that the limiting bump 1513 could move in the limiting recess 1082.

In one embodiment, a surface of each of the accommodating grooves 108 orthogonal to the first direction X and away from the first inner surface 10a further comprises a first stopping gap 1083 penetrates the second end surface 10e of the housing 10. In this embodiment, the first stopping gap 1083 is disposed on the first housing 100a. One side of each of the latching elastic pieces 151 away from the release bump 1512 is provided with a first stopping bump 1514 disposed between the release bump 1512 and the release handle 152. In this embodiment, the first stopping bump 1514 is close to the joint between the latching elastic piece 151 and the release handle 152. When each of the latching elastic pieces 151 is movably disposed in the corresponding accommodating groove 108, the first stopping bump 1514 would extend into the corresponding first stopping gap 1083. Each of the latching elastic pieces 151 could move in the accommodating groove 108, and the first stopping bump 1514 could also move in the first stopping gap 1083. A surface of the first stopping gap 1083 of the first stopping gap 1083 in the second direction Y could block the first stopping bump 1514 from moving in a direction closing to the first end surface 10d of the housing 10 to locate the position of the latching elastic piece 151 in the accommodating groove 108. In one embodiment, the first stopping gap 1083 of this embodiment further penetrates the lower surface of the housing 10. The latching component 15 further comprises a reinforced connecting member 153. Two ends of the reinforced connecting member 153 are respectively connected with the first stopping bump 1514 of each of the latching elastic pieces 151. The reinforced connecting member 153 is disposed on the lower surface of the housing 10, and the two latching elastic pieces 151 are connected through the reinforced connecting member 153 to increase the structural strength of the two latching elastic pieces 151.

In one embodiment, the surface of each of the accommodating grooves 108 in the first direction X further comprises a second stopping gap 1084 penetrating the second end surface 10e of the housing 10. The second stopping gap 1084 of this embodiment is disposed on the first housing 100a. One side of each of the latching elastic pieces 151 having the release bump 1512 is further provided with a second stopping bump 1515 opposite to the first stopping bump 1514. The second stopping bump 1515 is disposed between the release bump 1512 and the release handle 152. In this embodiment, the second stopping bump 1515 is close to the joint between the latching elastic piece 151 and the release handle 152. When each of the latching elastic pieces 151 is movably disposed in the corresponding accommodating groove 108, the second stopping bump 1515 would extend into the corresponding second stopping gap 1084. Each of the latching elastic pieces 151 moves in the accommodating groove 108, and the second stopping bump 1515 also moves in the second stopping gap 1084. A surface of the second stopping gap 1084 in the second direction Y could block the second stopping bump 1515 from moving in a direction closing to the first end surface 10d of the housing 10 to locate the position of the latching elastic piece 151 in the accommodating groove 108.

In summary, embodiments of the present disclosure provide an electrical connector. By partitioning the accommodating space and the plurality of through grooves with the shielding member, communication between the accommodating space and the outside of the electrical connector through a plurality of through grooves can be effectively blocked. Thus, the shielding member could perform electromagnetic shielding, and the electrical connector could perform excellent signal transmission. Besides, when the shielding member is made of a material having high heat conductivity, such as metal, which would harvest and retain the heat. When the external air flows through the plurality of through grooves, the heat harvested by the shielding member can be brought away from the electrical connector, which effectively improves the heat dissipation of the electrical connector, and allows the electrical connector to perform both excellent signal transmission and heat dissipation. The housing and the shielding member can be made of a material according to the required performance of the electrical connector since they are separately disposed. In this way, the electrical connector can be prevented from not performing as expected due to material selection. Meanwhile, the manufacturing of the shielding member and the housing could be simplified for reducing costs.

It is to be understood that the term "comprises", "comprising", or any other variants thereof, is intended to encompass a non-exclusive inclusion, such that a process, method, article, or device of a series of elements not only comprise those elements but further comprises other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. An electrical connector with shielding covering heat dissipating elements, comprising:
   a housing comprising an accommodating space and a plurality of through grooves, the plurality of through grooves being disposed on an inner surface of the housing along a first direction at intervals, each of the through grooves extending in a second direction and penetrating the housing, the second direction being orthogonal to the first direction;
   a circuit board being disposed in the accommodating space and protruding from the housing;
   a cable disposed in the accommodating space, one end of the cable protruding from the housing, one end of the cable disposed in the accommodating space being connected to the circuit board; and
   a shielding member being disposed in the accommodating space and covering the plurality of through grooves, the accommodating space and the plurality of through grooves being partitioned by the shielding member;

a latching component movably disposed on the housing, and the latching component comprising two latching elastic pieces symmetrically disposed and a release handle connected to the two latching elastic pieces, one end of each of the two latching elastic pieces away from the release handle comprising a buckling recess, two opposite outer surfaces of the housing in the first direction respectively comprising an accommodating groove, each of the accommodating grooves extending along the second direction, the two latching elastic pieces respectively movably disposed in the corresponding accommodating grooves, the release handle extending away from the housing;

wherein the inner surface comprises an accommodating gap closer than the plurality of through grooves to the accommodating space; the shielding member is disposed in the accommodating gap; two opposite sidewalls of the accommodating gap in the second direction respectively comprises an engaging recess; two opposite ends of the shielding member are respectively provided with an engaging bump; each of the engaging bumps is disposed in the corresponding engaging recess wherein a surface of the accommodating groove in the first direction further comprises a release recess extending along the second direction; one side of the latching elastic piece is provided with a release bump; the release bump is disposed in the release recess and moves in the release recess.

2. The electrical connector with shielding covering heat dissipating elements according to claim 1, wherein the shielding member abuts against a plurality of partition sidewalls among the plurality of through grooves, so that each of the through grooves becomes an independent channel.

3. The electrical connector with shielding covering heat dissipating elements according to claim 1, wherein the number of the engaging recesses is multiple; the plurality of the engaging recesses are respectively disposed on the two opposite sidewalls of the accommodating gap in the second direction at intervals; the number of the engaging bumps is multiple; the plurality of engaging bumps are respectively disposed at two ends of the shielding member at intervals.

4. The electrical connector with shielding covering heat dissipating elements according to claim 1, wherein the housing comprises a first housing and a second housing disposed on the first housing; the plurality of through grooves are disposed on an inner surface of the second housing at intervals.

5. The electrical connector with shielding covering heat dissipating elements according to claim 1, wherein the housing is made of a material different from the material of the shielding member.

6. The electrical connector with shielding covering heat dissipating elements according to claim 1, wherein the accommodating groove comprises a recessed part disposed between two opposite end surfaces of the housing; the buckling recess is disposed in the recessed part.

7. The electrical connector with shielding covering heat dissipating elements according to claim 1, wherein the width of the release bump in the second direction is narrower than the width of the release recess in the second direction.

8. The electrical connector with shielding covering heat dissipating elements according to claim 1, further comprising two elastic members respectively disposed in the corresponding release recesses; each of the elastic members extends along the second direction; one end of each of the elastic members abuts against the release bump; the other end of the elastic member abuts against a surface of the release recess away from the release bump.

9. The electrical connector with shielding covering heat dissipating elements according to claim 1, wherein two opposite surfaces of the accommodating groove in a direction orthogonal to the first direction further comprise a limiting recess extending along the second direction; two sides of the latching elastic piece are provided with a limiting bump; each of the limiting bumps is disposed in the corresponding limiting recess and moves in the limiting recess.

10. The electrical connector with shielding covering heat dissipating elements according to claim 1, wherein a surface of the accommodating groove in a direction orthogonal to the first direction comprises a stopping gap penetrating an end surface of the housing; one side of the latching elastic piece is provided with a stopping bump; the stopping bump is disposed in the stopping gap and moves in the stopping gap.

11. The electrical connector with shielding covering heat dissipating elements according to claim 10, wherein the stopping gap further penetrates a lower surface of the housing; the latching component further comprises a reinforced connecting member, two ends of which are connected with the two stopping bumps; the reinforced connecting member is disposed on the lower surface of the housing.

12. An electrical connector with shielding covering heat dissipating elements, comprising:
a housing comprising an accommodating space and a plurality of through grooves, the plurality of through grooves being disposed on an inner surface of the housing along a first direction at intervals, each of the through grooves extending in a second direction and penetrating the housing, the second direction being orthogonal to the first direction;
a circuit board being disposed in the accommodating space and protruding from the housing;
a cable disposed in the accommodating space, one end of the cable protruding from the housing, one end of the cable disposed in the accommodating space being connected to the circuit board; and
a shielding member being disposed in the accommodating space and covering the plurality of through grooves, the accommodating space and the plurality of through grooves being partitioned by the shielding member, and the shielding member comprising a positioning hole;
wherein a plurality of partition sidewalls between two adjacent through grooves is provided with a positioning column to be disposed in the positioning hole.

13. An electrical connector with shielding covering heat dissipating elements, comprising
a housing comprising an accommodating space and a plurality of through grooves, the plurality of through grooves being disposed on an inner surface of the housing along a first direction at intervals, each of the through grooves extending in a second direction and penetrating the housing, the second direction being orthogonal to the first direction;
a circuit board being disposed in the accommodating space and protruding from the housing;
a cable disposed in the accommodating space, one end of the cable protruding from the housing, one end of the cable disposed in the accommodating space being connected to the circuit board; and
a shielding member being disposed in the accommodating space and covering the plurality of through grooves, the accommodating space and the plurality of through grooves being partitioned by the shielding member;
a heat conducting member disposed between the shielding member and the cable.

14. The electrical connector with shielding covering heat dissipating elements according to claim 13, wherein the shielding member comprises a shielding plate body and a plurality of limiting pieces; the plurality of the limiting pieces are disposed on two opposite sides of the shielding plate body; the heat conducting member is disposed between the shielding plate body and the cable; the plurality of the limiting pieces extend toward the accommodating space and are disposed on two sides of the heat conducting member, the cable and the circuit board.

15. The electrical connector with shielding covering heat dissipating elements according to claim 14, wherein a supporting bump is provided on two inner surfaces of the housing in the first direction; one end of each of the plurality of limiting pieces away from the shielding plate body abut against the corresponding supporting bumps.

* * * * *